LOW FREQUENCY REACTANCE AMPLIFIER INCLUDING BOTH UP-CONVERSION AND NEGATIVE RESISTANCE AMPLIFICATION WITH GAIN CONTROL

Original Filed Feb. 11, 1960 3 Sheets-Sheet 1

JAMES R. BIARD
*INVENTOR.*

BY A. M. Hassell

Attorney

JAMES R. BIARD
*INVENTOR.*

*BY* A. M. Hassell

Attorney

JAMES R. BIARD
INVENTOR.

BY A. M. Hassell
Attorney

United States Patent Office 3,316,421

Patented Apr. 25, 1967

3,316,421

LOW FREQUENCY REACTANCE AMPLIFIER INCLUDING BOTH UP-CONVERSION AND NEGATIVE RESISTANCE AMPLIFICATION WITH GAIN CONTROL

James R. Biard, Richardson, Tex., assignor to Texas Instruments Incorporated, Dallas, Tex., a corporation of Delaware Continuation of application Ser. No. 8,013, Feb. 11, 1960. This application May 21, 1965, Ser. No. 457,776

13 Claims. (Cl. 307—88.3)

This application is a continuation of pending application Ser. No. 8,013, filed February 11, 1960, and now abandoned.

This invention relates to amplifiers and more particularly to amplifiers in which non-linear reactances serve as the amplifying elements.

Reactance amplifiers heretofore known fall into one or the other of two categories depending upon which of two phenomena principally underlie the amplification process. One of these categories is that of the negative resistance type amplifier in which a constant frequency alternating voltage and the signal to be amplified are concurrently applied to a non-linear reactance. Conventionally, the constant frequency alternating voltage is known as the pump, and is selected at a frequency higher than that of the highest signal to be amplified. When a signal to be amplified is applied to the amplifier, an idler signal appears at the terminals of the non-linear reactance. This idler signal has a frequency equal to the difference between the pump and signal frequencies.

Although the frequency of the pump is ordinarily many times that of the highest signal to be amplified, it is not necessary that such be the case. Thus, for example, the signal frequency may be one-half that of the pump, in which event the idler frequency would be equal to that of the signal frequency.

In operation, advantage is taken of the fact that power dissipated at a lower sideband or idling frequency reflects a negative resistance into the input signal source, and this negative resistance results in input signal gain.

The other of the above-mentioned categories is that of the sum-frequency up-converter which exploits conversion gain realized as the result of the relative impedances of the circuit elements and the voltages developed thereacross by currents which are produced through the interaction of the input signal with a component of time-varying reactance. The principles that underlie conversion gain are described in an article entitled, "Some General Properties of Nonlinear Elements," by J. M. Manley and H. E. Rowe, published at p. 904 of vol. 44 of the Proceedings of the Institute of Radio Engineers, July 1956.

Both types of reactance amplifiers make use of the fact that when an undulating signal is fed into or taken from a non-linear reactance element, the magnitude of the power is directly or inversely proportional to the frequency or functions of the frequencies of the varying signal on the non-linear reactor. Thus, by providing a pump having a frequency higher than that of the signal to be amplified, it is possible in a non-linear reactance element for a given amount of signal power to cause a greater amount of power to be taken from the pump source and converted into power at sideband frequencies. The greater the carrier (pump) to signal ratio, the greater the amplification theoretically obtainable, and based on this consideration alone, it might appear advantageous to make the pump frequency many times that of the signal frequency. However, certain practical considerations tend to restrict this ratio.

Reactance amplifiers operate at such an exceedingly low noise level that they have heretofore found their greatest utility in amplifying very weak signals. Since it is required that a pump signal be of substantial amplitude in order to swing a non-linear impedance (i.e., the mixer) through a significant region of reactance non-linearity, the pump signal will normally be at least an order of magnitude stronger than the input signal. Consequently, the pump frequency component in the mixer output so masks the upper and lower sidebands that the additional amplifiers which are conventionally required to bring the level of the sidebands to a usable value become swamped by the pump frequency component unless some means is provided to eliminate or greatly attenuate it.

It has heretofore been the practice to eliminate the pump signal by employing a plurality of high-Q tuned circuits. In one embodiment, this has taken the form of three such circuits, one tuned to the pump frequency, one to the idling frequency, and one to the signal frequency. According to this arrangement, the pump signal is introduced to the non-linear reactance by the pump tuned circuit, and it is rejected by the high-Q circuits tuned to signal and idling frequencies. In another embodiment, a high-Q circuit tuned to pump frequency is inserted serially in the output, and the pump frequency thereby rejected.

Although these techniques have been employed to satisfactorily attenuate the pump signal, they have limited the usable ratios between the pump and signal frequencies, for the greater the ratio between the pump frequency and the signal frequency, the smaller the percentage deviation of the lower and upper sidebands from the pump itself, and the greater the difficulty with which separation can be accomplished. Thus, it has not heretofore been found practical to utilize a parametric amplifier to amplify signals of very low frequencies, i.e., frequencies of less than a few hundred cycles.

Since reactance amplifiers are known to offer the advantage of amplification with very little noise addition, it is now proposed to embody the principles thereof in a practical amplifier which through the employment of the features of this invention overcomes disadvantages heretofore exhibited by prior art low frequency amplifiers.

It is one general object of this invention to improve non-linear reactance amplifiers.

It is another object of this invention to minimize cost, size, weight, and power consumption in a low-level, low-frequency, substantially noise-free amplifier.

It is yet another object of this invention to maximize signal input impedance in order that power gain of the amplifier may be rendered exceedingly large.

It is still another object of this invention to extend the frequency range of non-linear reactance amplifiers to include signals of low frequencies and direct current.

It is still a further object of this invention to improve gain control by rendering it smoothly variable over a wide range.

It is yet another object of this invention to improve amplifier stability and to simplify the automatic control of amplifier gain.

It is yet a further object of this invention to render attenuation of the pump signal self-regulating.

Consequently, in accordance with one feature of the invention, upper and lower sideband voltages resulting from the interaction of the input signal with components of time-varying capacitance are developed across a common impedance, and the upper and lower sideband frequencies are relatively close, thereby resulting in the effective cancellation of positive and negative powers at the input terminal with a resulting maximizing of input impedance.

In accordance with still another feature of the invention, a pair of non-linear reactances are arranged in a balanced bridge circuit, and are effective both to mix the pump and signal frequencies and to controllably attenuate the pump signal itself, thereby advantageously eliminating the necessity for separate pump attenuating circuits.

In accordance with still a further feature of the invention, provision is made for tuning the circuit across which the amplifier output voltages are developed, thereby permitting the smooth control of amplifier gain by changing the circuit tuning.

In accordance with yet another feature of the invention, the pump signal is introduced to the balanced bridge circuit through a transformer having a split secondary winding, whereby the bridge elements may be individually biased without introducing appreciable loading on the carrier source.

In accordance with still another feature of the invention, provision is made in one embodiment for sensing the level of the pump component emanating from the bridge and for compensatorily varying the degree of bridge unbalance to maintain such level substantially constant.

In accordance with yet another feature of the invention, in another embodiment, provision is advantageously made for exploiting the pump voltage in a dual capacity: one, as a vehicle by which the gain of the amplifier is sensed and stabilized, and two, as the driving voltage for swinging the non-linear impedance elements through significant regions of non-linearity.

In accordance with still a further feature of the invention, in yet another embodiment, bridge balance is compensatorily adjusted to maintain a substantially constant pump component level in the output and, at the same time, the tuning of the amplifier gain-control circuits is automatically adjusted to prevent the level of the output signal from exceeding a predetermined value.

In accordance with still another feature of the invention, the bridge is connected in series with the previously mentioned tuned circuit, and these two are arranged to interconnect the pump and signal sources, thus imparting many of the features to the combination and rendering feasible the advantageous inclusion of the remainder.

These and other objects and features of the invention will be apparent from the following detailed description, by way of example, with reference to the drawing in which.

Figure 1:
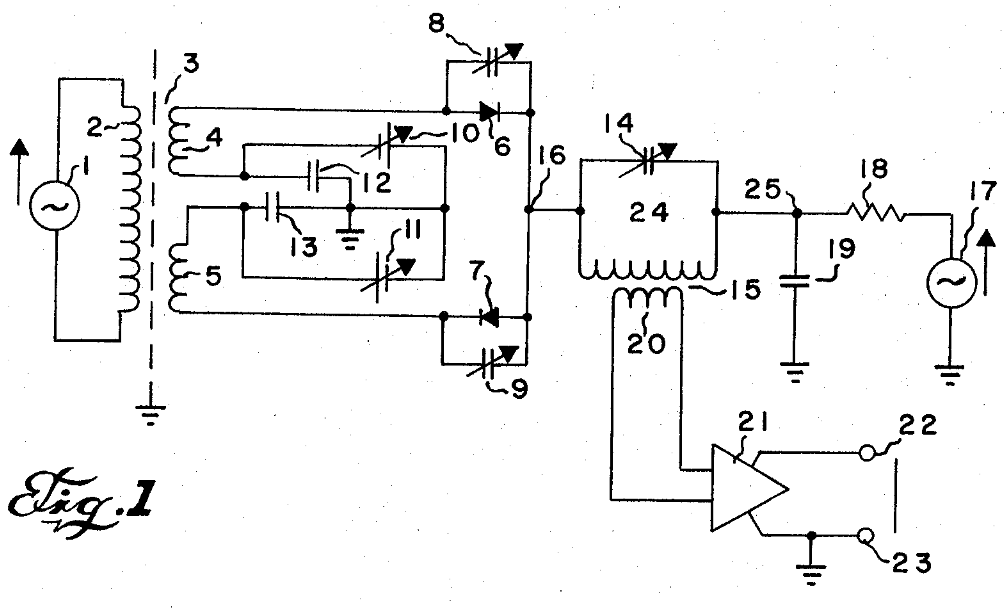
FIGURE 1 is a schematic diagram depicting a basic embodiment of the invention.

Now turning to the drawing, and more particularly to FIGURE 1, it will be noted that there is depicted in schematic form an amplifier in accordance with the basic principles underlying this invention. Beginning at the left-hand portion of the circuits, a source of pump signal 1 is observed connected across the primary winding 2 of transformer 3. Although it is not necessary to operation of the circuits, the advantages thereof may be best obtained if the transformer is electrostatically shielded (as shown) and if the two secondary windings 4 and 5 are bifilar wound, thereby to provide balanced input voltages to the hereinafter described bridge circuit.

Referring to the center portion of the figure, it will be observed that two diodes 6 and 7 are serially connected with windings 4 and 5 to form a bridge. Diodes 6 and 7 are paralleled by trimmer capacitors 8 and 9, the latter being included for three reasons. The first of these is to compensate for any residual difference in diode characteristics; the second is to provide a means for adjustment to compensate for any undesired imbalance in input voltages from windings 4 and 5; and the third is to permit a controlled capacitive imbalance of slight proportions whereby the pump signal is not completely eliminated, but a tiny amount thereof is passed through to the following circuits for reasons that will hereinafter be apparent.

In considering the polarities of the windings 4 and 5 together with those of diodes 6 and 7, it may be helpful to recognize that the diodes are poled so that the cathode of diode 6 is connected to the anode of diode 7. Moreover, the windings 4 and 5 are poled in such manner that the voltages impressed upon diodes 6 and 7 in series will be additive, i.e., the voltage appearing at the upper terminal of winding 4 will be 180° out of phase with the voltage appearing at the lower terminal of winding 5.

As heretofore mentioned, the bridge is dependent for its operation upon the inclusion of a non-linear reactance. In the embodiments contemplated by this application, non-linear capacitance is exhibited by diodes 6 and 7. As will be expected, the particular characteristics desired in diodes 6 and 7 may vary depending upon the use to which the amplifier circuits are to be put. Moreover, it will be appreciated that when one desired characteristic of the amplifier is optimized, others may not necessarily be so. Consequently, there may be applications for the circuits herein described in which compromise is necessary between various factors to achieve the most desirable over-all results.

In observing the circuits of FIGURE 1, it will be seen that sources of variable biasing potential 10 and 11 are severally connected between ground and terminals of diodes 6 and 7. Thus, source 10 is connected at its positive terminal to ground, and is connected at its negative terminal through the winding 4 to the anode of diode 6. Similarly, except for reversal of polarity, battery 11 is connected at its negative terminal to ground, and at its positive terminal to the cathode of diode 7 through winding 5.

As will be apparent from the following detailed description, it may not be necessary to employ sources of biasing potential 10 and 11 in all embodiments of the circuits. While the characteristics of presently obtainable diodes are such that in order to secure the desired swing in capacitance without forward biasing it is necessary to provide some residual reverse bias, advances in the diode art may result in the production of elements having varying capacitance-versus-voltage characteristics such that the required capacitance swing can be effected without residual biasing. Consequently, it should be understood that not only the values of the battery biasing voltages but the necessity for using bias voltages at all will depend upon the particular application and upon the characteristics desired in the amplifier.

Capacitors 12 and 13 are employed to by-pass batteries 10 and 11 at pump frequency, thereby completing an effective series circuit around the bridge. The values of these capacitors are not critical, but should be sufficient to exhibit a relatively low reactance at the pump frequencies involved.

Returning momentarily to transformer 3, it may be of interest to observe that although it is not necessary for the secondary windings 4 and 5 to be tightly coupled, such may be advantageous, for as will be hereinafter seen, in-phase currents flowing to the outer terminals of windings 4 and 5 (upper terminal of winding 4 and lower terminal of winding 5) will be most effectively returned to ground through low impedance when such is the case.

Now referring to the right-hand section of FIGURE 1, it will be observed that it includes a parallel tank circuit comprised of trimmer capacitor 14 and the inductance represented by coupling transformer 15. It will be observed that this tank circuit is serially interconnected between junction 16 and input signal source 17 through a resistor 18 which is included to simulate the internal impedance of the signal source 17. Capacitor 19, which is connected between one terminal of the tank and ground, is included to by-pass signal source 17 at pump frequency, thereby minimizing the coupling of pump signal into the signal source 17.

Further considering the transformer 15, it will be observed that its secondary 20 is connected to amplifier 21 and that the output of amplifier 21 is impressed upon terminals 22 and 23 whence it may be employed for any useful purpose.

It will be appreciated by one skilled in the art that the secondary winding 20 may be tuned and/or that the coupling between primary and secondary may be variably adjusted depending on the bandwidth desired and the optimum reflection of the input impedance of amplifier 21 into tank 24.

Now considering the operation of the circuits, it will be apparent that the pump signal is effective to swing the diodes 6 and 7 through substantial regions of non-linear capacitance. Thus, as the pump signal varies sinusoidally, the values of the capacitance presented by diodes 6 and 7 between point 16 and ground vary periodically according to non-linear functions of the pump voltage.

In order to achieve the desired amplification, it is necessary that the input signal be reacted with the time-varying capacitance. Consequently, provision is made for the application of input signal voltage from source 17 to terminal 16 via the obvious path through the primary winding of couplng transformer 15 which, incidentally, exhibits a relatively low impedance at the input signal frequency.

Although capacitor 19 is effective in by-passing signals of pump frequency, it is sufficiently small to present a relatively large reactance at input signal frequencies and, consequently, does not appreciably by-pass them to ground. The value of capacitor 19 together with resistance 18 of source 17 and the average capacitance exhibited by the diode bridge will determine the signal frequency bandwidth of the amplifier.

Now turning particularly to the operation of the circuits, the pump source 1 is activated to swing diodes 6 and 7 through a regularly-repetitive cycle of non-linear capacitance change. The circuits are then ready for the application of the signal which is to be amplified, and this is introduced from signal source 17 over the previously-mentioned path through the winding of coupling transformer 15 to junction 16 where it is impressed upon terminals of the diodes 6 and 7.

As is well known in the art, whenever two signals of different frequencies are concurrently impressed upon non-linear elements, a series of frequencies is produced. This series includes the sums and differences of the two applied signal frequencies. Furthermore, when, as is the case here, a signal is impressed upon a time-varying, non-linear capacitance, currents are developed at frequencies equal to the fundamental and each of the harmonics of the time-varying capacitance plus and minus the frequency of the applied signal. Thus, for example, if the angular velocity (angular frequency) of the pump is represented by $p$, and if the angular velocity (angular frequency) of the signal is represented by $a$, then there will appear currents at angular velocities equal to $$p\pm a,\ 2p\pm a\ \ldots\ np\pm a$$

However, the circuits are so constructed as to present very small impedances to all of these components except those of $p\pm a$ and, consequently, the voltages developed at any angular velocity other than those of $p\pm a$ are insignificant.

Since the time-varying capacitance is non-linear, it will itself exhibit capacitance components which vary not only at the fundamental rate but at harmonics thereof. Because such is inherent in the characteristics of the diodes as swung through their cyclical variations by the pump voltage, the higher harmonic components of time-varying capacitance will remain and, as will be presently observed, will interact with voltages derived from the heretofore-mentioned fundamental currents (i.e., $p\pm a$) to produce an advantageous negative resistance effect. This time-varying capacitance may be represented by $$c(t)=c_1 \cos pt+c_2 \cos 2pt+c_3 \cos 3pt+\ \ldots$$

As heretofore mentioned, the effective tank 24 is tuned substantially to the frequency of the pump signal. Since in the embodiment herein contemplated any frequencies resident in the input signals will be so far removed from the fundamental frequency of the pump that the upper and lower sidebands will fall well within the bandpass of the parallel tank 24, the heretofore-mentioned fundamental currents produced in the bridge will effectively develop corresponding voltages across the primary winding of transformer 15 whence they are reflected into the secondary winding 20 and thence to amplifier 21.

As mentioned before, it is contemplated that the pump signal will not be entirely suppressed in the balanced modulator, for its inclusion to a small controlled degree may greatly facilitate subsequent detection. However, it should be understood that it is not necessary to include any of the pump signal at all and that the output from the amplifier could take the form of a double sideband suppressed carrier signal.

Even if no negative resistance effect were exhibited by the circuits, there would nevertheless be moderate voltage amplification. Such amplification may be termed "mixer amplification," for it is dependent upon the current produced by the interaction of the signal voltage and the fundamental component of the time-varying capacitance. Thus, if such current is said to equal the product of the signal voltage $E_a$ and the susceptance of the fundamental component of the time-varying capacitance, denominated $b_1$, i.e., $b_1=pc_1$ then this generated current will be equal to $E_a b_1$; and since this current must flow through the tank 24, the voltage developed across tank 24 will be directly proportional to the admittance ($y$) of the tank. Since the admittance of the tank can be made substantially less than the susceptance of the fundamental component of the time-varying capacitance, the input voltage $E_a$ will in effect be multiplied by the ratio of $b_1$:$y$, thereby producing voltage amplification.

As mentioned above, the circuits of this invention not only achieve voltage amplification through conversion multiplication, but in addition advantageously exploit the relationship of the second harmonic component of the time-varying capacitance and the heretofore-mentioned upper and lower sideband currents to effectively introduce negative conductance at the upper and lower sideband frequencies. In order that this may be readily understood, it may be helpful to begin by considering equations that define the characteristics of the circuits. Thus, from an examination of the circuits and from reference to the analysis set forth in an article by H. E. Rowe entitled "Some General Properties of Non-Linear Elements," appearing at pps. 850–860 in the May 1958 issue of the Proceedings of the IRE, it will be observed that the equations which define circuit operation include the following:

$$I_a=Y_a E_a-jac_1{}^*V_s-jac_1V_d{}^* \qquad (1)$$
$$0=(g+jb_\Delta)V_d-jb_1E_a{}^*+jb_2V_s{}^* \qquad (2)$$
$$0=(g+jb_\Delta)V_s-jb_1E_a+jb_2V_d{}^* \qquad (3)$$

* denotes complex conjugate, where $b_1=pc_1$, $b_2=pc_2$, $b_\Delta=pc_\Delta$, $c_\Delta$ is the change in $c_{14}$ (either positive or negative) from that value required for resonance in the passive output tank, $c_2$ is the second harmonic component of the time-varying capacitance, $g$ is the total conductance in the output tank and includes the loading effect of the input conductance of the amplifier 21, and $Y_a$ is the passive admittance between point 25 and ground.

In the above equations it has been assumed that $a<<p$ that $$p+a\cong p-a\cong p$$

A simultaneous solution of Equations 2 and 3 results in Equation 4 as follows:

$$V_o=V_s+V_d=$$

$$[2b^1E_a]\left[\frac{\sqrt{g^2+(b_2-b_\Delta)^2}}{g^2-(b_2^2-b_\Delta^2)}\right]\cos at\cos\left(pt+\Phi\frac{\pi}{2}\right)\quad(4)$$

where $$\Phi=\tan^{-1}\frac{b_2-b_\Delta}{g}$$

The left-hand term of Equation 4, which is seen to be the sum of the upper and lower sideband voltages, represents the double sideband suppressed carrier signal previously mentioned.

The right-hand side of the equation may be advantageously considered in terms of its functional significance in two parts. The first of these is $(2b_1E_a)$, and this portion of the equation will be seen to be twice that previously given as representing current produced by the interaction of the signal voltage and the fundamental component of the time-varying capacitance. Thus, whereas previously such current was said to equal $E_ab_1$ (for this related to only one of the two sidebands), the expression $2b_1E_a$ represents currents at *both* the upper and lower sideband frequencies.

The remaining part of the right-hand portion of Equation 4 defines the interrelationships of circuit parameters which give rise to the active admittance presented by tank 24 to the upper and lower sideband currents.

If the tank 24 were characterized by electrical passivity (i.e., if the part of Equation 4 that defines tank admittance did not include the $b_2$ terms) and if the tank were tuned to resonance so that the $b_\Delta$ terms disappeared, then Equation 4 would be simplified to the following form:

$$V_o=\frac{2b_1E_a}{g}\cos at\cos\left(pt+\frac{\pi}{2}\right)\quad(5)$$

It will now be seen that Equation 5 defines operation of the circuits in terms of amplification that is due solely to the mixer amplification to which reference has heretofore been made.

However, since the second harmonic of the time-varying capacitance is inherently present, and since therefore $b_2$ will of necessity appear in the equation that defines the circuits, there will be under certain conditions of tuning a negative conductance which is effectively reflected into the tank circuit. In order to understand this phenomenon, detailed reference may be made to the $b_2$ and $b_\Delta$ terms in Equation 4, and it will be helpful to understand that the magnitude of $b_2$ is dependent upon the magnitude of the pump voltage. Thus, with any given fixed pump voltage, the magnitude of $b_2$ is correspondingly fixed. However, the $b_\Delta$ term is a function of the tuning of the tank circuit only, and may vary from zero in either the positive or negative direction depending upon whether trimmer capacitor 14 is tuned to values above or below those required for passive resonance in tank 24.

Now if it be considered that capacitor 14 is adjusted to a value at which the $b_\Delta$ terms disappear, then Equation 4 reduces to the following form:

$$V_o=2b_1E_a\frac{\sqrt{g^2+b_2^2}}{g^2-b_2^2}\cos at\cos\left(pt+\Phi+\frac{\pi}{2}\right)\quad(6)$$

Referring to Equation 6, it will be apparent that the terms involving $g$ and $b_2$ in the denominator are subtractive and that therefore the denominator is decreased by the magnitude of $b_2^2$. Consequently, the net admittance presented to the aforementioned sum and difference sideband currents is decreased, and those currents are therefore effective to develop an enhanced voltage within tank 24. It is this decrease in net admittance and the resulting enhancement of developed voltage which are the manifestations of the negative resistance effect to which reference has heretofore been made.

In view of the fact that the negative resistance effect is dependent upon tank tuning, it will be observed that the amplifier gain can be varied over a wide range which approaches infinity when $g^2-(b_2^2-b_\Delta^2)$ approaches zero. Thus, a smoothly variable control of gain is available and can be exploited by simply varying the tuning of tank 24.

Figure 2:
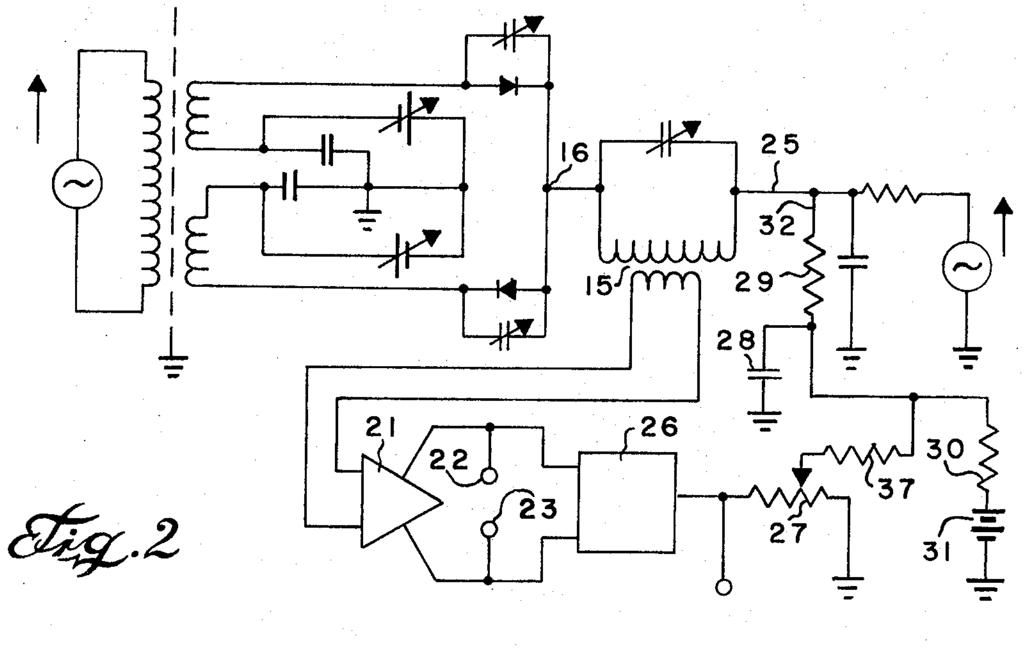
FIGURE 2 depicts a similar circuit in which feedback is arranged to provide the heretofore-mentioned variable unbalance.

FIGURE 2 schematically represents circuits identical to those of FIGURE 1 except for the inclusion of elements 26–31 and 37 which, when connected as shown, are effective to maintain substantially constant the level of the pump signal permitted to pass through the bridge and tank to amplifier 21. This control is accomplished in the following manner.

Not only is the output from amplifier 21 conveyed to output terminals 22 and 23, but as will be observed in FIGURE 2, it is additionally extended to detector 26. Detector 26 rectifies a portion of the signal to derive a direct current voltage proportional to the average amplitude of the signal received (i.e., proportional to the level of the carrier). This direct current voltage may be divided by tapped resistor 27 (as shown), or if its level is substantially that required to effect desired circuit response, it may be impressed at full strength upon point 25 via conductor 32 and the smoothing and de-coupling network which comprises capacitor 28, battery 31 and resistors 29, 37 and 30. From terminal 25, it is conducted through the primary winding of transformer 15 to terminal 16 where it is effective to change the bias of diodes 6 and 7. Thus, a controlled unbalance of the bridge may be effected, and since the level of the carrier (i.e., pump component) passed therethrough is a function of the degree of unbalance, the level of the unbalancing voltage conveyed to terminal 16 over the feedback loop will maintain the output carrier level substantially constant.

It will be apparent to one skilled in the art that if the output voltage from detector 26 is positive (as contemplated by this embodiment) then the direction of unbalance initially established in the bridge should be in a direction such that an increase in the magnitude of the voltage developed at the output of detector 26 will tend to effect a decrease in the degree of unbalance. Otherwise, if the original unbalance of the bridge is in the other direction, the effect will be cumulative, and regulation will not take place.

Although battery 31 and resistor 30 are not essential to the operation of the circuits, optimum control may result when they are included, for then adjustment of the voltage divider comprising resistors 27 and 30 may be made to result in the application of zero D.C. potential via lead 32 to point 25 when initially establishing the desired degree of bridge imbalance. Thus, control will result from a change in either the positive or negative direction from zero, thereby permitting the optimization of various circuit settings.

Figure 3:
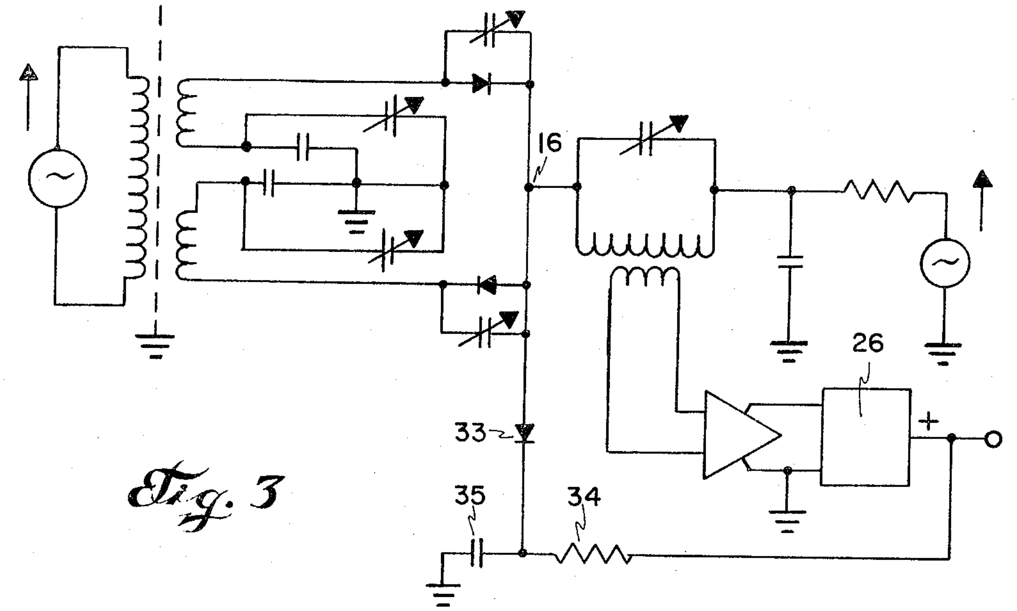
FIGURE 3 depicts a modified embodiment of the circuits of FIGURE 1 in which provision is made for compensatorily adjusting the amplifier to maintain the gain substantially constant.

Now turning to FIGURE 3, it will be seen that schematically portrayed therein are circuits somewhat similar to those of FIGURE 1 except for modification to provide a controlled feedback which tends to maintain the gain of the amplifier constant by maintaining the average output D.C. voltage substantially constant.

As will be observed from an examination of the expressions which characterize the circuits, the negative resistance effect is particularly sensitive to changes in pump voltage when the amplifier is adjusted to operate at high gains. Thus since $b_2$ varies approximately as the square of the pump voltage, i.e., $b_2 \alpha e_p^2$), $b_2$ squared varies approximately as the fourth power of the pump voltage (i.e., $b_2^2 \alpha e_p^4$), and the $g^2 - b_2^2$ term (Equation 6) varies as $1 - e_p^4$ when $ep \cong 1$. Consequently, it may be advantageous to stabilize the circuits against undesired changes in gain which would otherwise occur when the pump voltage might change as a result of variations in temperature, supply voltages, etc. Such stabilization is advantageously accomplished in the circuits of FIGURE 3 by the action of reverse-biased diode 33.

For an understanding of the manner in which stabilization is accomplished, it will be helpful to understand that the voltage produced at detector 26 is conveyed via smoothing and decoupling network comprising resistor 34 and capacitor 35 to the cathode of diode 33 where it is effective to reverse bias it. Since the capacitance exhibited by the diode varies with the magnitude of applied reverse bias voltage, it will be apparent that as the output voltage from detector 26 varies, so will the capacitance exhibited by diode 33.

In order to understand the effects produced by the variation in capacitance of diode 33, it will be helpful to refer to Equation 4 and especially to the $b_\Delta$ terms thereof. As heretofore mentioned, when the tank is tuned to resonance, the $b_\Delta$ terms disappear. However, any variation in the capacitance exhibited by diode 33 from that at which the tank is tuned to resonance, will result in the introduction of $b_\Delta$ terms, and the gain of the circuits will be correspondingly changed.

One of the properties of the circuits of this invention is that the heretofore-mentioned negative resistance characteristic is equally effective to change the tank impedance presented to that portion of the pump voltage permitted to pass the unbalanced bridge as it is to the various currents mentioned above. Thus, any change in gain due to the variation in negative resistance results in a change in the pump component presented to detector 26. Since the level of the direct current voltage present at the output of detector 26 is a measure of the amplitude of the pump component presented thereto, such voltage may be used to vary the capacitance of diode 33 in a sense to compensate for changes and thereby introduce substantially whatever degree of $b_\Delta$ susceptance that is required to maintain the negative resistance portion of the amplifier gain substantially constant. Thus, it will be seen that advantage is taken of the fact that a signal other than the signal to be normally amplified (i.e., a pilot signal) undergoes an amplification that has a direct correlation in terms of the degree of amplification to which the signal-to-be-amplified will be given; consequently, the degree to which a portion of the pump signal is amplified can be expressed in correspondingly varying electrical representations which are used to stabilize signal gain.

It should be noted that in order to avoid eliminating or degrading the output signal from the amplifier, it will be necessary that the time constant of resistor 34 and capacitor 35, together with any time-constant-affecting elements within detector 26, be sufficiently great to prevent inordinately rapid response. When this is done, the gain of the amplifier will be stabilized and it can be adjusted to operate at extremely high values of amplification without danger of oscillation.

Figure 4:
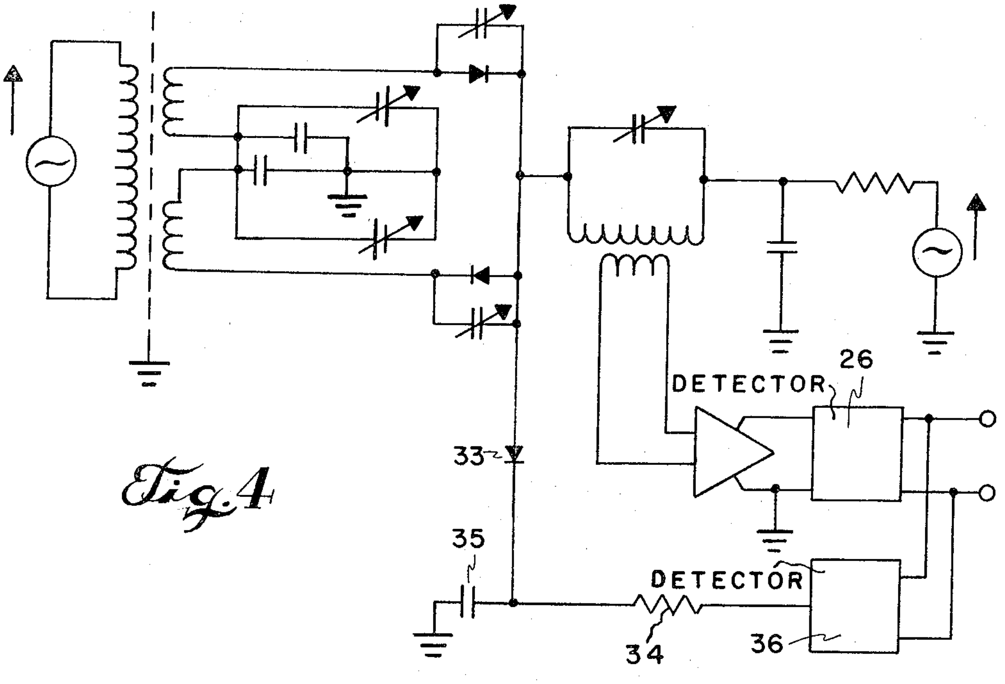
FIGURE 4 depicts still another modified embodiment of the circuits of FIGURE 1 in which the gain of the amplifier is automatically varied to maintain the amplitude of the output signal substantially constant.

FIGURE 4 depicts circuits structurally similar to those of FIGURE 3 except for an additional detector 36. Although element 36 has been termed a detector, it may, depending upon the type of gain control desired, take the form of any one of the well known voltage output producing devices which respond to average levels, peak levels, R.M.S., etc.

Although, as mentioned above, detector 36 may take any one of a variety of forms, for the purposes of this description it will be assumed that it produces a voltage proportional to an average of the amplified signal level (*not* pump). Consequently, the voltage fed via resistor 34 to bias diode 33 will vary in accordance with an average level of the amplified signal and it will be effective to change the capacitance exhibited by diode 33 in the manner described in relation to the circuits of FIGURE 3 to compensatorily change the negative resistance portion of the gain in the circuits thereby to maintain the average level of the output signals substantially constant.

Device 36 could be employed as a limiter which would not be effective to produce a varying gain until some predetermined threshold level of signal output amplitude had been reached or exceeded. Similarly, any one of the other well known types of control could be employed through the advantageous conduction of the appropriate biasing voltage to the indicated point of connection to diode 33.

Figure 5:
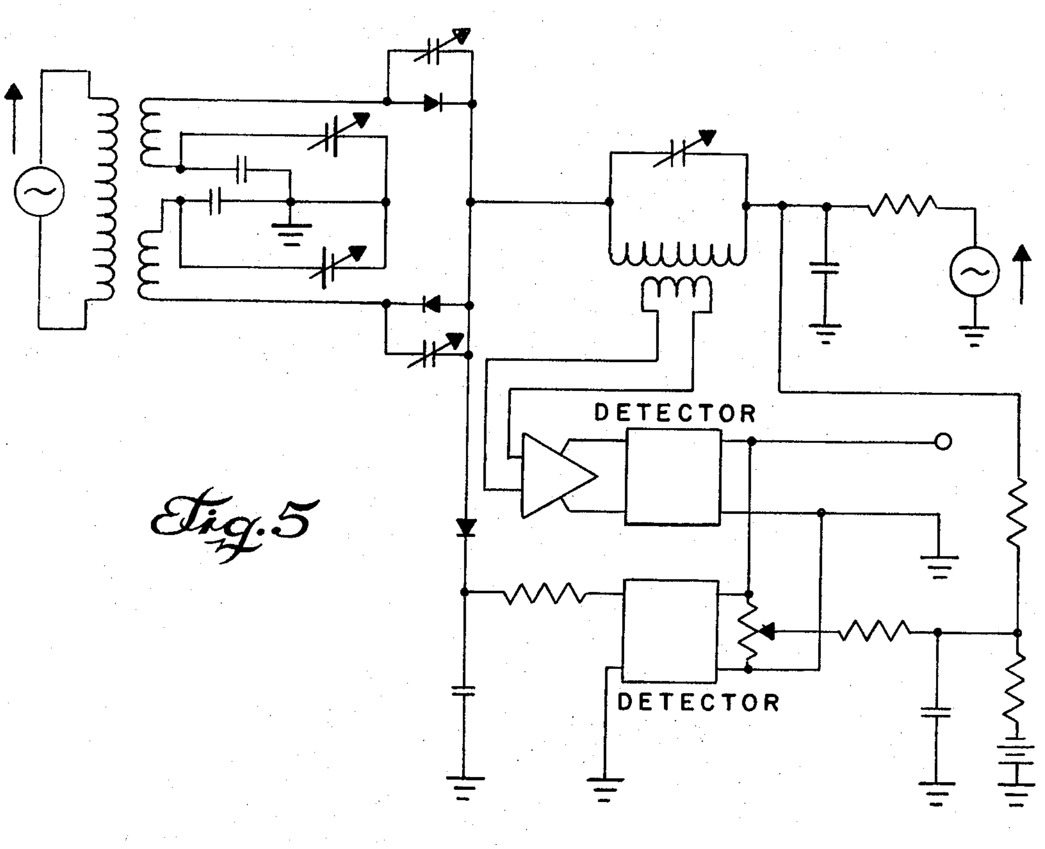
FIGURE 5 depicts another embodiment in which automatic variation is made of both bridge unbalance and amplifier gain.

The specific embodiments featured in FIGURES 3 and 4, while offering many attractive possibilities for gain stabilization, do not readily lend themselves to cooperative action each with the other. Thus, for example, if it were desired to incorporate both the feedback arrangement of FIGURE 3 and that of FIGURE 4 in the same circuit, there might be a relationship of the derived voltages in such manner as to oppose each other and thereby degrade over-all performance. It will be apparent, however, that if the principles embodied in FIGURE 2 are incorporated in the circuits of FIGURE 4, both circuit stabilization and automatic volume control features can be obtained. Thus, circuit stabilization is brought about through a controlled unbalance of the bridge as a result of the voltage introduced to point 25 (FIGURE 2), whereas automatic volume control is effected in the manner described for the circuits of FIGURE 4. Since one depends upon bridge unbalance, and the other upon a change in the negative resistance gain, there is no conflict therebetween and the advantages of both can be enjoyed. Such an arrangement is schematically depicted in FIGURE 5.

Figure 6:
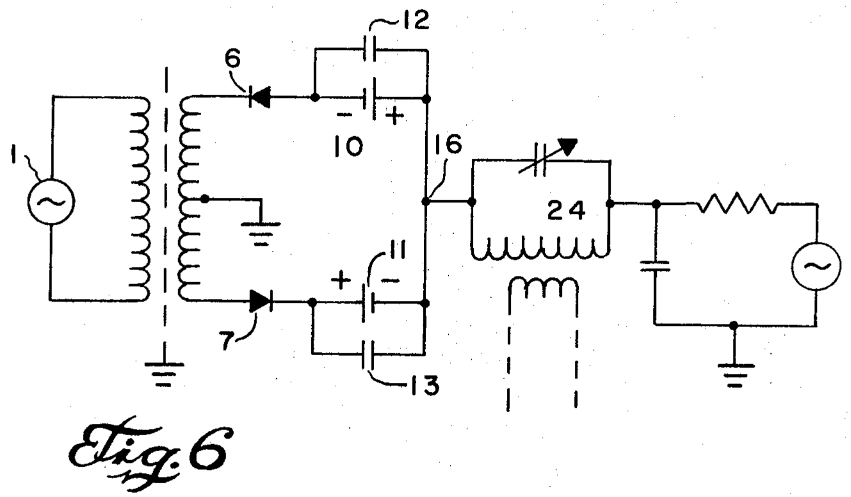
FIGURE 6 depicts still another embodiment in which a continuous center-tapped winding is used to replace the two secondary windings of the preceding embodiments.

Now turning to FIGURE 6, an alternative arrangement for the bridge and biasing portions of the circuits is shown in skeleton form. From an inspection, it will be seen that the split secondary winding of the preceding figures has been replaced by a single center-tapped secondary and that individual biasing of the bridge diodes is effected by the individual batteries 10 and 12 which are separately by-passed by capacitors 12 and 13. The remainder of the circuits is seen to be identical to those heretofore described, and the operation thereof, including all the various features embodied in FIGURES 2–4 inclusive may be readily adapted thereto.

Although the invention has been illustrated by certain specific embodiments, other modifications and adaptations may occur to those skilled in the art.

The words and expressions employed are intended as terms of descriptions and not of limitation, and there is no intention in the use thereof of excluding any equivalents but on the contrary it is intended to include any and all equivalents, adaptations and modifications that may be employed without departing from the spirit or scope of the invention.

What is claimed is:

1. In an amplifier, a pair of non-linear capacitance elements connected in a bridge, driving means for driving both of said elements at a constant angular velocity through regions of capacitance non-linearity, the elements being effective to produce fundamental and second harmonic components of time-varying capacitance, an input terminal for receiving signals to be amplified by said amplifier, resonance means tunable to frequencies corresponding to said constant angular velocity plus and minus the frequencies of input signals applied to said input terminal, means including said resonance means responsive to the interaction of the fundamental component of said time-varying capacitance with said input signal for developing in said resonance means an amplified replica of said input signal, and means including said resonance means responsive to the interaction of the second harmonic of said time-varying capacitance with said amplified replica of said input signal for further amplifying the replica of said input signal.

2. An amplifier according to claim 1 in which the magnitude of the further amplification of said amplified replica of said input signal varies according to the tuning of said resonance means.

3. In an amplifier having non-linear reactance amplifying means, means for driving said non-linear reactance amplifying means through regions of reactance non-linearity, and variably tunable resonance means connected to said non-linear reactance amplifying means effective when variably tuned for varying the gain of said amplifier; means for stabilizing said gain comprising sensing means connected to said resonance means for sensing the level of electrical signal within said resonance means, signal-responsive variable reactance means connected to said resonance means, and means connected to said sensing means responsive to the level of said electrical signal for deriving and applying a corresponding signal to said variable reactance means to compensatorily vary the tuning of said resonance means to maintain the gain of said amplifier below a predetermined level.

4. Circuits according to claim 3 in which said means connected to said sensing means comprises a detector and a signal-time-averaging circuit connecting the output of said detector to said variable reactance means.

5. Circuits according to claim 3 in which said means connected to said sensing means comprises a first detector coupled to said sensing means, a second detector connected to said first detector, and a signal-time-averaging circuit connecting the output of said second detector to said variable reactance means.

6. In an amplifier:

(a) a pair of non-linear reactance elements,
(b) means connecting the pair of elements together in a bridge,
(c) means for driving the pair of elements at a constant angular velocity through regions of reactance non-linearity,
(d) a pair of input terminals for receiving signals to be amplified, the frequencies of such signals being significantly less than a frequency which corresponds to the constant regular velocity,
(e) resonance means tuned to a narrow frequency band including said frequency corresponding to the constant angular velocity, the resonance means exhibiting substantial response at said frequency plus and minus the signal frequencies, the resonance means being effective to develop a voltage at said frequency when the bridge is unbalanced,
(f) conductive means serially connecting the resonance means with the bridge and serially connecting the input terminals with the bridge,
(g) and means coupled to the resonance means effective when the reactance elements the driven at the constant angular velocity and when an input signal is applied to the input terminals for providing an amplified replica of the input signal.

7. An amplifier according to claim 6 wherein said means for driving both of said elements at a constant angular velocity through regions of impedance non-linearity comprises a source of alternating voltage.

8. An amplifier according to claim 6 wherein said non-linear reactance elements exhibit non-linearity in capacitance as a function of applied voltage.

9. An amplifier according to claim 8 wherein said non-linear reactance elements are semiconductor diodes.

10. In an amplifier:

(a) a pair of non-linear reactance elements,
(b) means connecting the pair of elements in the arms of a bridge circuit,
(c) driving means coupled to the pair of elements for driving both of the elements through regions of reactance non-linearity at a constant angular velocity,
(d) resonance means tunable to a frequency band which includes a frequency corresponding to said constant angular velocity,
(e) signal input means for receiving signals to be amplified, the signals having frequencies much less than that corresponding to said constant angular velocity,
(f) and means connecting the signal input means and the resonance means in a closed series circuit with the bridge circuit.

11. An amplifier according to claim 10 wherein the frequency band of subparagraph (d) includes said frequency corresponding to said constant angular velocity plus and minus the frequencies of the signals of subparagraph (e).

12. An amplifier according to claim 10 wherein the resonance means of subparagraph (d) is variably tunable to said frequency band so that the voltage appearing across the resonance means at the frequency corresponding to said constant angular velocity is selectable in magnitude.

13. In an amplifier for amplifying very low frequency signals:

(a) a pair of semiconductor diodes exhibiting nonlinear capacitance as a function of applied voltage,
(b) means separately connecting the diodes in two adjacent arms of a bridge,
(c) a pump source coupled to the bridge to impress a high frequency voltage upon the diodes,
(d) a pair of input terminals adapted to be connected to a source of signals to be amplified, the signals being of frequency much lower than said high frequency of said pump source,
(e) a variably tunable tank circuit tunable to a narrow band including said high frequency plus and minus the frequencies of the signals, the tank circuit exhibiting very low impedance at the frequencies of the signals,
(f) conductive means connecting the tank circuit and the bridge in series between the pair of input terminals,
(g) and output means coupled to the tank circuit to derive therefrom an output voltage having components corresponding to the frequencies of said narrow band, the magnitude of the component at said high frequency being dependent upon the degree of unbalance of the bridge.

No references cited.

ROY LAKE, *Primary Examiner.*

D. R. HOSTETTER, *Assistant Examiner.*